(12) United States Patent
Ota et al.

(10) Patent No.: US 11,063,322 B2
(45) Date of Patent: Jul. 13, 2021

(54) CIRCUIT BODY AND BATTERY MODULE

(71) Applicant: YAZAKI CORPORATION, Tokyo (JP)

(72) Inventors: Takao Ota, Shizuoka (JP); Junya Iwata, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 112 days.

(21) Appl. No.: 16/508,024

(22) Filed: Jul. 10, 2019

(65) Prior Publication Data

US 2020/0020912 A1    Jan. 16, 2020

(30) Foreign Application Priority Data

Jul. 13, 2018   (JP) .............................. JP2018-133503

(51) Int. Cl.
*H01M 2/20*      (2006.01)
*H01R 12/77*     (2011.01)
(Continued)

(52) U.S. Cl.
CPC ...... *H01M 50/502* (2021.01); *H01R 12/7005* (2013.01); *H01R 12/77* (2013.01);
(Continued)

(58) Field of Classification Search
CPC ... B60L 50/64; G01R 31/3644; G01R 31/396; H01M 10/425; H01M 10/482; H01M 2/202; H01M 2/206; H01M 50/502; H01R 12/7005; H01R 12/77; H02J 2310/48; H02J 7/0042; H05K 1/118; H05K 2201/055; H05K 2201/10037; Y02E 60/10; Y02T 10/70
See application file for complete search history.

(56) References Cited

U.S. PATENT DOCUMENTS

2012/0212232 A1* 8/2012 Ikeda ................... H01M 2/206
                                                    324/426
2012/0328920 A1* 12/2012 Takase ................ H01M 2/0285
                                                    429/90

(Continued)

FOREIGN PATENT DOCUMENTS

JP    2013-105522 A    5/2013
JP    2017-199804 A    11/2017

*Primary Examiner* — Lingwen R Zeng
(74) *Attorney, Agent, or Firm* — Kenealy Vaidya LLP (57) ABSTRACT

A circuit body includes: a plurality of conductors and a substrate having flexibility and provided with the conductors, in which the substrate includes a battery wiring portion which is routed along each row of electrodes and where one ends of the conductors are respectively connected to bus bars, and a pair of connector connecting portions in which the other ends of the conductors provided in respective battery wiring portions are located, the pair of connector connecting portions include a connector mounting portion where the pair of connector connecting portions are guided from opposite directions, and in the connector mounting portion, the other ends of the conductors of the pair of the connector connecting portions are alternately arranged and an arrangement order corresponds to the potential order of the bus bars connected to the conductors.

9 Claims, 8 Drawing Sheets

(51) Int. Cl.
  H01R 12/70    (2011.01)
  H05K 1/11     (2006.01)
  H01M 50/502   (2021.01)
  *G01R 31/36*      (2020.01)
  *G01R 31/396*     (2019.01)
  *H02J 7/00*       (2006.01)
  *H01M 10/42*      (2006.01)
  *H01M 10/48*      (2006.01)
  *B60L 50/64*      (2019.01)

(52) U.S. Cl.
  CPC .............. *H05K 1/118* (2013.01); *B60L 50/64* (2019.02); *G01R 31/3644* (2013.01); *G01R 31/396* (2019.01); *H01M 10/425* (2013.01); *H01M 10/482* (2013.01); *H02J 7/0042* (2013.01); *H02J 2310/48* (2020.01); *H05K 2201/055* (2013.01); *H05K 2201/10037* (2013.01); *Y02E 60/10* (2013.01); *Y02T 10/70* (2013.01)

(56) References Cited

U.S. PATENT DOCUMENTS

| | | |
|---|---|---|
| 2014/0370343 A1 | 12/2014 | Nomoto et al. |
| 2016/0268577 A1 | 9/2016  | Ichikawa et al. |
| 2017/0318663 A1 | 11/2017 | Kondo et al. |

\* cited by examiner

CIRCUIT BODY AND BATTERY MODULE

CROSS REFERENCE TO RELATED APPLICATIONS

This application is based on and claims priority from Japanese patent application No. 2018-133503 filed on Jul. 13, 2018, the entire contents of which are incorporated herein by reference.

BACKGROUND OF THE INVENTION

1. Technical Field

The present invention relates to a circuit body and a battery module.

2. Background Art

A battery module including a bus bar fixed to an electrode of each battery cell, a voltage detection line extending from the bus bar, and a connector for connecting the voltage detection line to an ECU is attached to a battery mounted in a hybrid car or an electric car. The ECU monitors the voltage of each battery cell detected through the voltage detection line of the battery module and adjusts the charge amount of the battery cell and the like. In those battery modules, there is one using a printed circuit body having a voltage detection line made of a conductor pattern in order to improve complicated wiring work of the voltage detection line to the battery (see, for example, JP-A-2017-199804).

SUMMARY

In a battery in which battery cells in each of which a positive electrode and a negative electrode are separated are connected in series, bus bars fixed to connection points are arranged at alternately separated positions. In a battery in which battery cells are connected in series, the voltage of the bus bars increases in order from one side of a circuit. Therefore, voltage detection lines extending from the bus bars to a connector are not arranged in the voltage order, which causes a circuit to be complicated by providing a circuit or the like which rearranges the voltage detection lines in the voltage order on an ECU side.

The invention is made in view of the circumstances described above and an object thereof is to provide a circuit body and a battery module capable of arranging voltage detection lines in the voltage order to simplify a circuit.

To attain the above object, the invention provides a circuit body and a battery module having features that are described below in the form of configurations (1) to (5):

(1) A circuit body which is attached to a battery assembly in which electrodes of a plurality of battery cells are arranged in two rows and two or more electrodes adjacent to each other in each row are connected by a conductive member, comprising:

a plurality of conductors and a substrate having flexibility and provided with the plurality of conductors, wherein     the substrate includes       a battery wiring portion which is routed along each row of the electrodes and where one ends of the plurality of conductors are respectively connected to the conductive members, and       a pair of connector connecting portions in which the other ends of the conductors provided in respective battery wiring portions are respectively located,     the pair of connector connecting portions include a connector mounting portion which is a position where the connector connecting portions are guided from opposite directions and connected and where the connector is mounted, and     in the connector mounting portion, the other ends of the conductors of the pair of the connector connecting portions are alternately arranged and an arrangement order corresponds to the potential order of the conductive members connected to the conductors.

(2) The circuit body according to above (1), wherein the substrate is formed of one sheet and includes a plurality of substrate portions having the battery wiring portions and the connector connecting portions.

(3) The circuit body according to above (1), wherein the substrate is formed of two sheets, and the connector mounting portion is located at a position where the connector connecting portions of the two substrates are connected in an opposite direction to each other.

(4) The circuit body according to above (3), wherein the connector connecting portions of the two substrates are overlapped in the connector mounting portion, and     a through hole for connecting the conductor of the substrate on a far side with respect to the connector and a terminal of the connector is formed in the substrate on a near side with respect to the connector.

(5) A battery module, comprising:

the circuit body according to above (1), a conductive member connected to one end of a conductor constituting the circuit body, and     a connector connected to the other end of the conductor.

According to the battery module configured as (1) described above, the battery wiring portions of the circuit body are wired along the respective rows of the electrodes of the battery cells and the conductors are connected to the bus bars fixed to the electrodes. Further, in the connector mounted on the connector mounting portion of the circuit body, the odd-numbered terminals are connected to the conductors of one battery wiring portion from one end side and the even-numbered terminals are connected to the conductors of the other battery wiring portion from one end side. Therefore, the conductors can be connected to the terminals of the connector attached to the connector mounting portion so as to be in the order of voltage of the battery assembly. Therefore, when connecting the connectors to the ECU which monitors the voltage of the battery cell and adjusts the charge amount and the like, it is not necessary to provide a circuit or the like for rearranging the voltage detection lines in the order of voltage on the ECU side, and thus the circuit can be simplified.

According to the circuit body configured as (2) described above, since the circuit body is formed of one substrate including the plurality of substrate portions having the battery wiring portions routed along respective rows of the electrodes of the battery cells and the connector connecting portions with the connector mounting portion to which the connector is attached, it is possible to improve the assembling efficiency to the battery assembly.

According to the circuit body configured as (3) described above, the battery wiring portions of two sheets of the substrates can be separately arranged and mounted with respect to the rows of the electrodes of the battery assembly. Thereby, the two sheets of the substrates can be easily attached to the battery assembly without being affected by the width of the row of electrodes and the like. Further, the circuit body can be manufactured with high yield as compared with a case where the circuit body is formed by one substrate.

According to the circuit body configured as (4) described above, in the connector mounting portion where two substrates are overlapped, the terminals of the connector can be securely connected to the conductors of the substrate on the near side with respect to the connector and the substrate on the far side.

According to the battery module configured as (5) described above, in the connector attached to the connector connecting portion, the terminals are arranged in the order of voltage of the battery assembly. Therefore, when connecting the connectors to an ECU which monitors the voltage of the battery cell and adjusts the charge amount and the like, it is not necessary to provide a circuit or the like for rearranging voltage detection lines in the order of voltage on an ECU side, and thus the circuit can be simplified.

According to the invention, it is possible to provide a circuit body and a battery module capable of arranging voltage detection lines in the voltage order to simplify a circuit.

Hereinbefore, the invention is briefly described. Furthermore, the details of the invention will be further clarified by reading the modes for carrying out the invention described below (hereinafter referred to as "embodiments") with reference to the accompanying drawings.

BRIEF DESCRIPTION OF THE DRAWINGS

FIGS. 4A and 4B are views for illustrating the circuit body provided with the connector of the battery module, where

FIGS. 6A to 6C are views illustrating a manufacturing process of the battery module, where

DETAILED DESCRIPTION OF EMBODIMENTS

Specific embodiments of the invention are described below with reference to the drawings.

Figure 1:
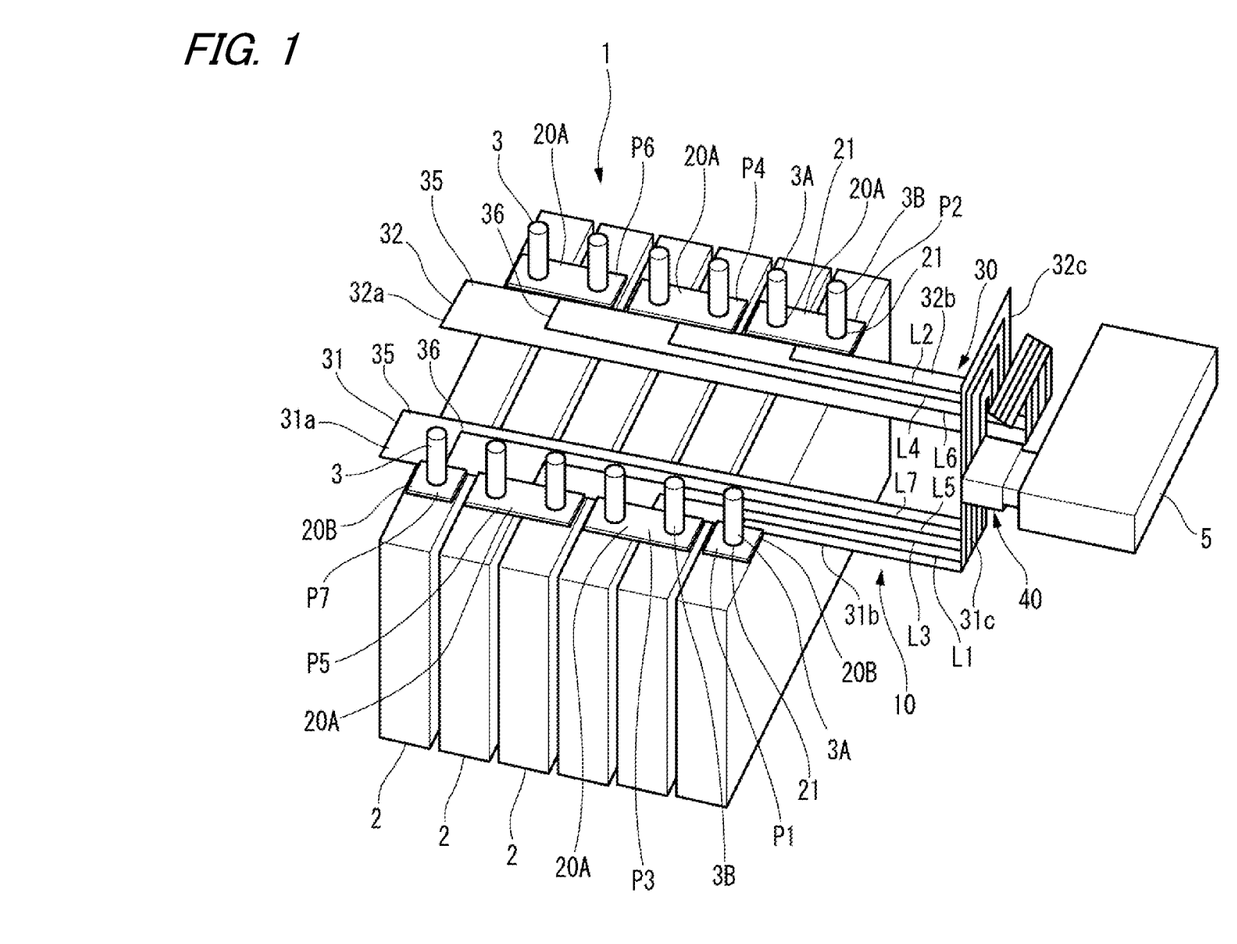
FIG. 1 is a perspective view of a battery assembly in which a battery module according to an embodiment is assembled.
Figure 2:
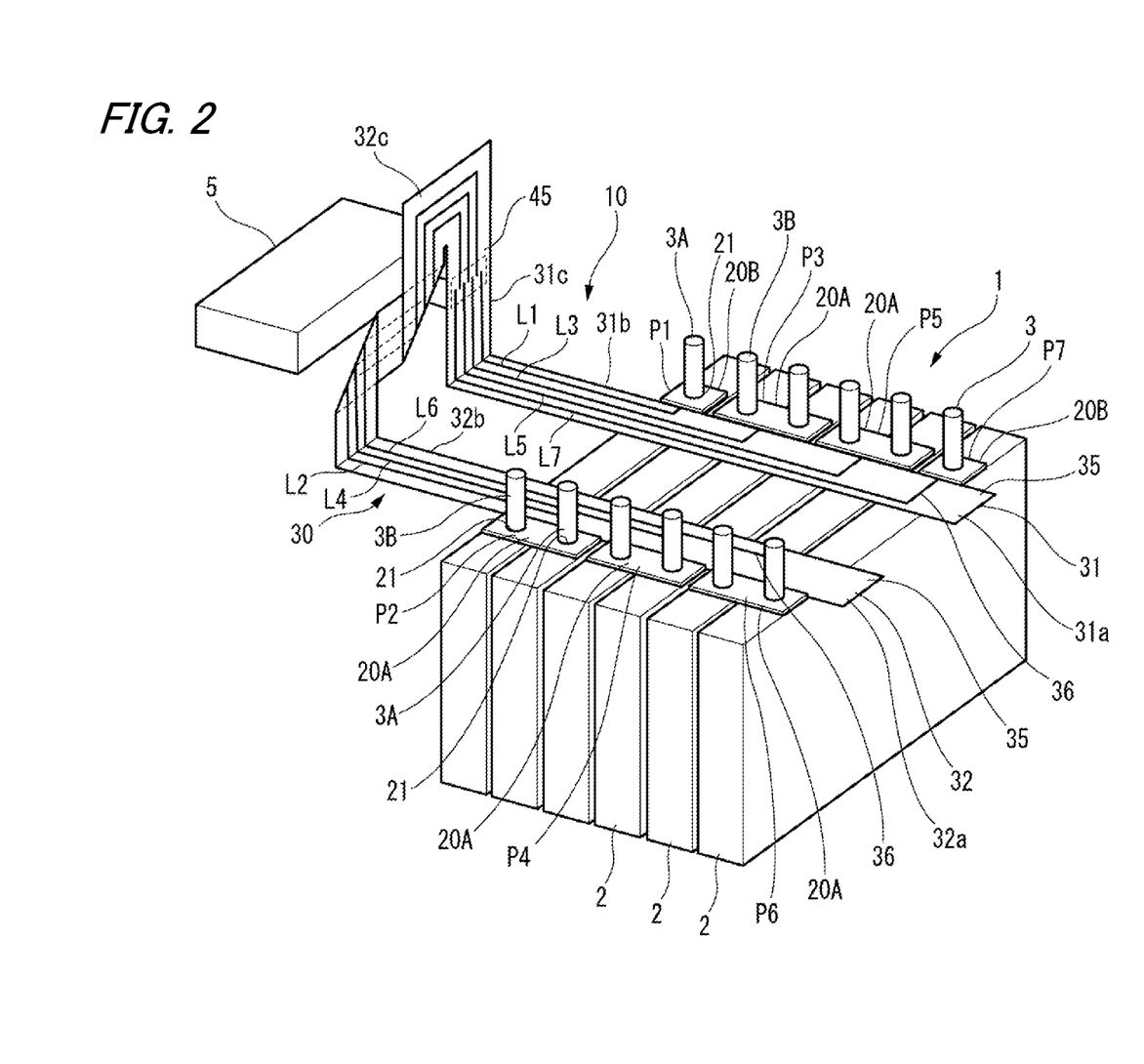
FIG. 2 is a perspective view from a rear of the battery assembly in which the battery module according to the embodiment is assembled.

FIG. 1 is a perspective view of a battery assembly in which a battery module according to the embodiment is assembled. FIG. 2 is a perspective view from a rear of the battery assembly in which the battery module according to the embodiment is assembled.

As illustrated in FIGS. 1 and 2, a battery module 10 according to the first embodiment is assembled to a battery assembly 1. The battery assembly 1 is used, for example, as a power source of an electric car, a hybrid car, or the like.

The battery assembly 1 is constituted of battery cells 2 composed of a plurality of secondary batteries.

The battery cells 2 are stacked on one another to constitute a battery assembly 1. Each battery cell 2 has a pair of electrodes 3 at the top. One of the pair of electrodes 3 is a positive electrode 3A and the other is a negative electrode 3B. The positive electrode 3A and the negative electrode 3B are disposed at mutually separated positions in each of the battery cells 2. The battery cells 2 are arranged alternately such that the positive electrode 3A and the negative electrode 3B are adjacent to each other, that is, the positive electrode side and the negative electrode side of the adjacent battery cells 2 are in the opposite direction. The battery module 10 is assembled between the arrays of electrodes 3 at the top of the battery assembly 1.

The battery module 10 includes bus bars 20A and 20B, a circuit body 30, and a connector 40.

The bus bars 20A and 20B are formed by pressing a plate made of a conductive metal material such as copper or copper alloy into a rectangular shape and each bus bar has a terminal insertion hole 21. Further, the bus bars 20A and 20B are not limited to copper or copper alloy as long as they are conductive metal materials and may be made of, for example, aluminum or aluminum alloy. The bus bar 20A has two terminal insertion holes 21 through which the positive electrode 3A and the negative electrode 3B are inserted and the bus bar 20B has one terminal insertion hole 21 through which the positive electrode 3A or the negative electrode 3B is inserted.

In the bus bar 20A, the adjacent positive electrode 3A and negative electrode 3B of two battery cells 2 are inserted into the terminal insertion holes 21. Further, the bus bar 20A is fastened to the positive electrode 3A and the negative electrode 3B by nuts (not illustrated) screwed into the positive electrode 3A and the negative electrode 3B. As a result, the adjacent positive electrode 3A and negative electrode 3B of two battery cells 2 are conducted by the bus bar 20A. In the bus bars 20B, the positive electrode 3A or the negative electrode 3B of two battery cells 2 disposed at end portions is inserted into the terminal insertion hole 21. Further, the bus bar 20B is fastened to the positive electrode 3A or the negative electrode 3B by a nut (not illustrated) screwed into the positive electrode 3A or the negative electrode 3B. In the battery assembly 1, the battery cells 2 are connected in series by the bus bars 20A and portions to which the bus bars 20A and 20B are fastened are taken as detection points P1 to P7 in order from the low potential side as points for detecting a voltage.

Figure 3:
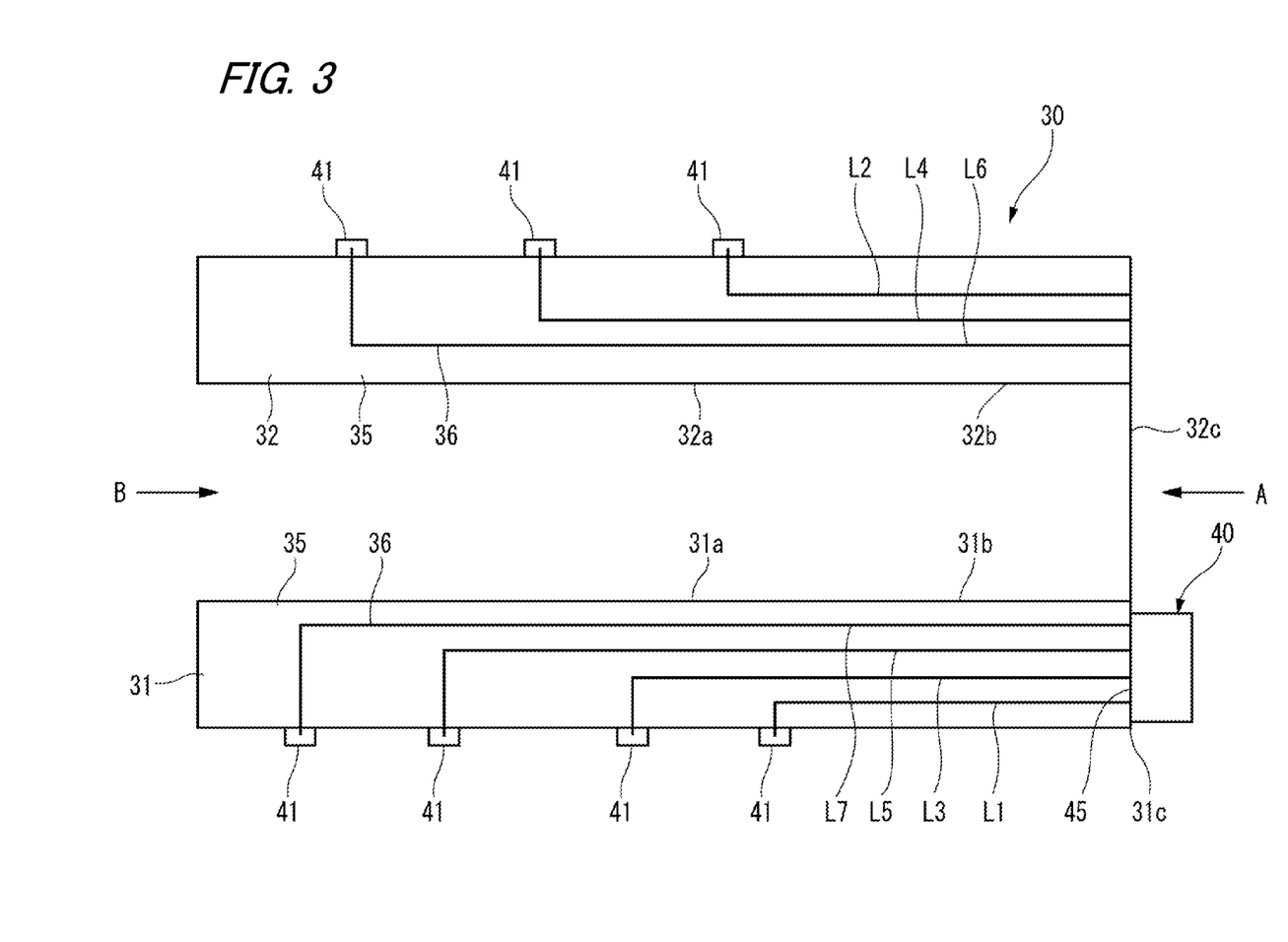
FIG. 3 is a plan view illustrating a circuit body provided with a connector of the battery module.
Figure 4A:
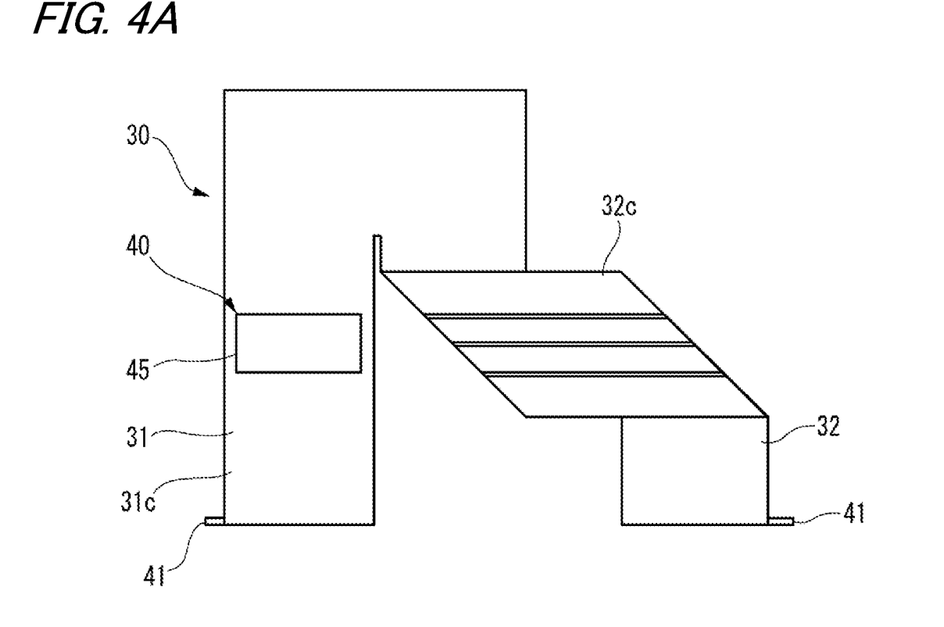
FIG. 4A is a view on the arrow A in FIG. 3
Figure 4B:
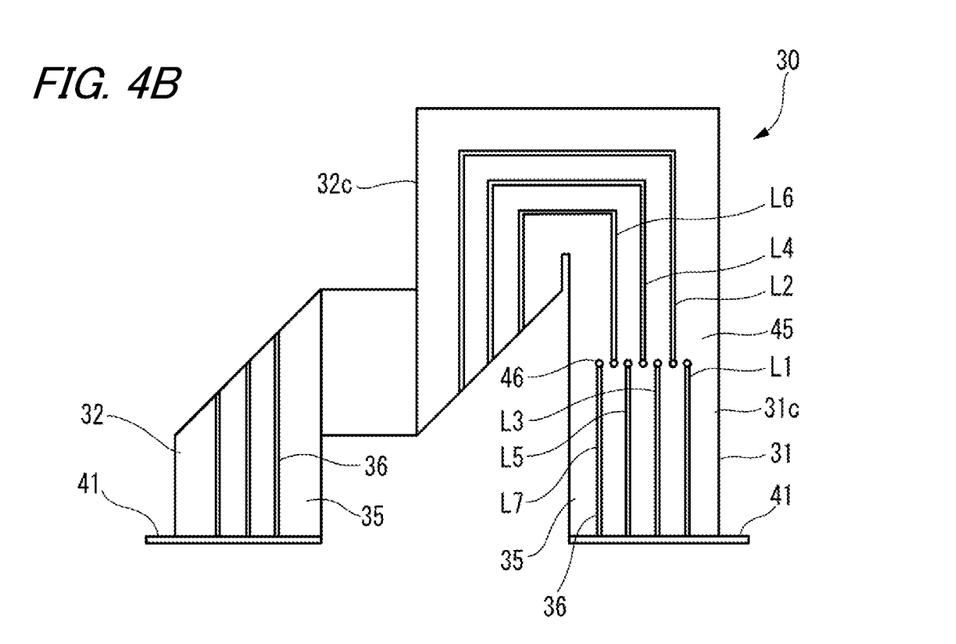
FIG. 4B is a view on the arrow B in FIG. 3.

FIG. 3 is a plan view for illustrating a circuit body provided with the connector of the battery module. FIGS. 4A and 4B are views for illustrating the circuit body provided with the connector of the battery module, where FIG. 4A is a view on the arrow A in FIG. 3 and FIG. 4B is a view on the arrow B in FIG. 3.

As illustrated in FIG. 3 and FIGS. 4A to 4B, the circuit body 30 has a first substrate portion 31 and a second substrate portion 32. The circuit body 30 is a single substrate made of a flexible printed circuit (FPC) having a base 35 and a conductor 36. The base 35 is constituted of a pair of flexible films bonded to each other and the conductor 36 made of a conductive metal foil is provided between the films.

The first substrate portion 31 and the second substrate portion 32 of the circuit body 30 have battery wiring portions 31a and 32a, connecting portions 31b and 32b, and connector connecting portions 31c and 32c. In the first substrate portion 31 and the second substrate portion 32, the battery wiring portions 31a and 32a are respectively wired along the two arrays of electrodes 3 in the upper portion of the battery assembly 1.

The battery wiring portions 31a and 32a of the first substrate portion 31 and the second substrate portion 32 have connection port portions 41 protruding from edge portions and one end of the conductors 36 is drawn into each connection port portion 41. In those connection port portions 41, there is no film on the upper side of the base 35 and one end of the conductor 36 is exposed on an upper surface. The bus bars 20A and 20B are overlapped and joined to the upper portions of those connection port portions 41. Thus, the bus bars 20A and 20B and the conductor 36 are electrically connected. As a method of joining the bus bars 20A and 20B in the connection port portion 41, for example, welding, caulking, fastening with a screw or the like may be used. Further, as the connection port portion 41, one end of the conductor 36 may be exposed on a lower surface. In this case, the bus bars 20A and 20B are overlapped and joined to a lower portion of the connection port portion 41.

In the first substrate portion 31 and the second substrate portion 32, the connecting portions 31b and 32b extend horizontally from the battery wiring portions 31a and 32a and the connector connecting portion 31c and 32c extend upward with respect to the connecting portions 31b and 32b. The connector connecting portion 32c of the second substrate portion 32 extends upward, is further bent and directed downward, and is connected to the connector connecting portion 31c of the first substrate portion 31. The connector connecting portion 32c of the second substrate portion 32 is connected to the connector connecting portion 31c of the first substrate portion 31 from the opposite side. Then, a connecting portion between the connector connecting portion 31c of the first substrate portion 31 and the connector connecting portion 32c of the second substrate portion 32 is a connector mounting portion 45 to which the connector 40 is mounted. The connector connecting portion 32c of the second substrate portion 32 is folded at two positions. As a result, the battery wiring portion 32a and the connecting portion 32b of the second substrate portion 32 are arranged at positions distant from the battery wiring portion 31a and the connecting portion 31b of the first substrate portion 31. When it is possible to make the battery wiring portions 31a and 32a of the first substrate portion 31 and the second substrate portion 32 be along the electrodes 3 of the battery cells 2, folding of the connector connecting portion 32c of the second substrate portion 32 does not necessarily have to be provided.

In the first substrate portion 31, the battery wiring portion 31a is routed along the detection points P1, P3, P5, and P7 and respective conductors 36 become voltage detection lines L1, L3, L5, and L7 connected to the detection point P1, P3, P5, and P7. Further, in the second substrate portion 32, the battery wiring portion 32a is routed along the detection points P2, P4, and P6 and respective conductors 36 become voltage detection lines L2, L4, and L6 connected to the detection point P2, P4, and P6.

In the connector mounting portion 45 of the circuit body 30, the conductors 36 of the first substrate portion 31 and the conductors 36 of the second substrate portion 32 are drawn from opposite sides of each other. In those conductors 36, voltage detection lines L2, L4, and L6 of the second substrate portion 32 are arranged between the voltage detection lines L1, L3, L5, and L7 of first substrate portion 31. Thus, in the connector mounting portion 45 of the circuit body 30, the conductors 36 are arranged in order of the voltage detection lines L1 to L7 from one side. That is, in the connector mounting portion 45, the end portions of the conductors 36 are arranged in the voltage order.

Figure 5:
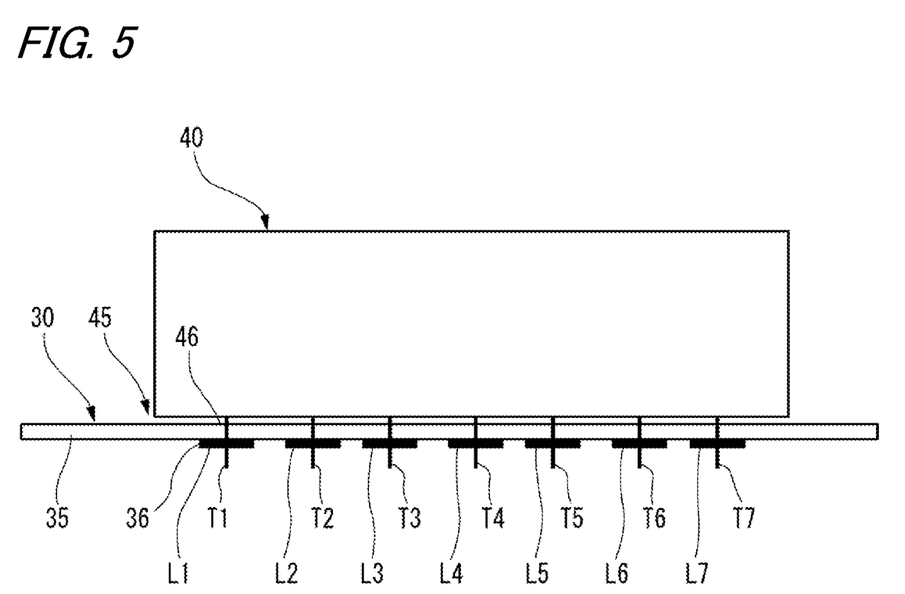
FIG. 5 is a schematic cross-sectional view of a connector mounting portion of the circuit body.

FIG. 5 is a schematic cross-sectional view of the connector mounting portion of the circuit body.

As illustrated in FIG. 5, in the connector mounting portion 45 of the circuit body 30, through holes 46 are formed at the positions of the conductors 36 of the voltage detection lines L1 to L7. The connector 40 has the same number of terminals T1 to T7 as the voltage detection line L1 to L7 and those terminals T1 to T7 are inserted into the through holes 46. Then, those terminals T1 to T7 are soldered to the conductors 36 and electrically connected.

The odd-numbered terminals T1, T3, T5, and T7 in the connector 40 are connected to the detection points P1, P3, P5, and P7 of the row of the electrodes 3 of the battery assembly 1 via the conductors 36 of the voltage detection line L1, L3, L5, and L7 of the first substrate portion 31. The even-numbered terminals T2, T4, and T6 in the connector 40 are connected to the detection points P2, P4, and P6 of the row of the electrodes 3 of the battery assembly 1 via the conductors 36 of the voltage detection line L2, L4, and L6 of the second substrate portion 32.

The connector 40 is connected to an Electronic Control Unit (ECU) 5 (see FIGS. 1 and 2). Thus, the voltage values of the voltage detection lines L1 to L7 of the circuit body 30 can be detected by the ECU 5.

Figure 6A:
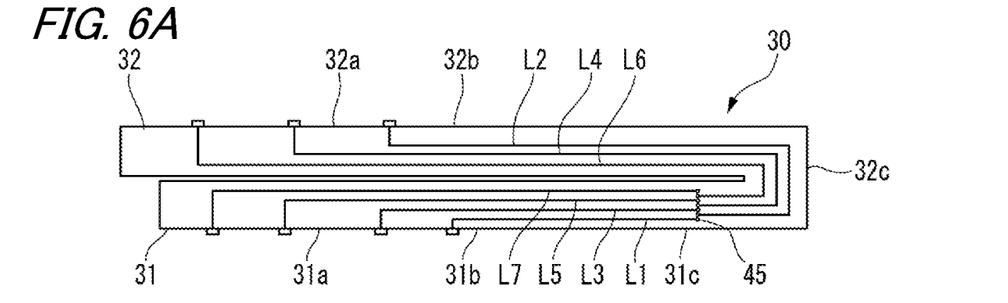
FIGS. 6A to 6C are plan views of the circuit body.
Figure 6B:
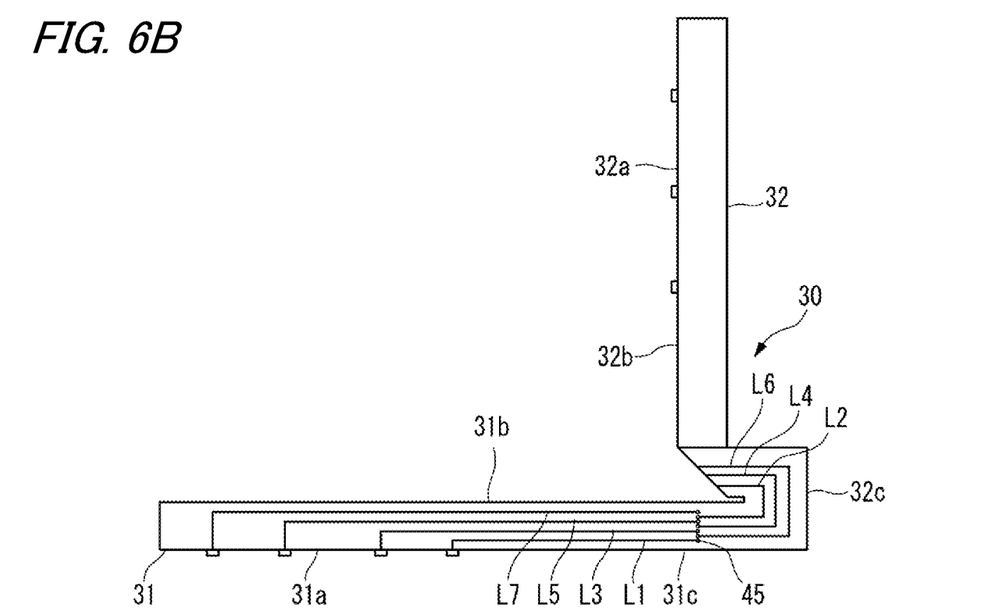
Figure 6C:
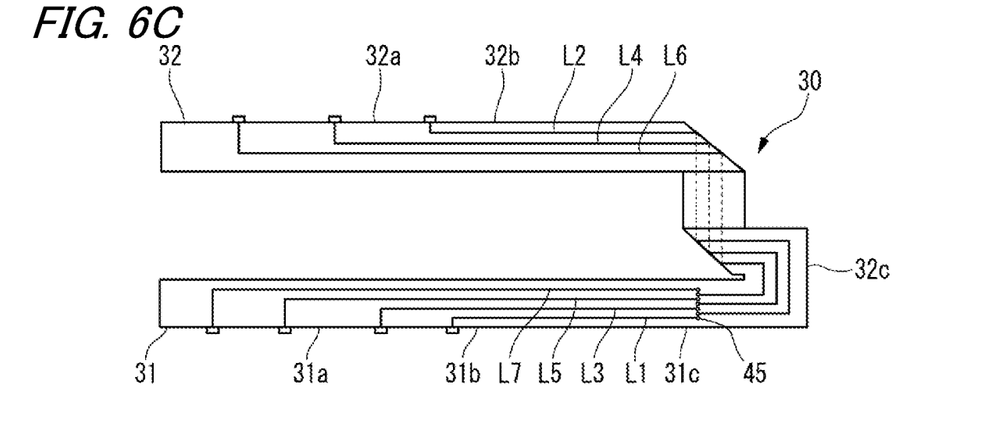

Next, a procedure for manufacturing the battery module 10 described above will be described. FIGS. 6A to 6C are views illustrating a manufacturing process of the battery module and FIGS. 6A to 6C are plan views of the circuit body.

As illustrated in FIG. 6A, the circuit body 30 formed of a flexible circuit board having the first substrate portion 31 and the second substrate portion 32 is formed. In the circuit body 30, the connector connecting portion 32c of the second substrate portion 32 is formed in a U-shape and the first substrate portion 31 and the second substrate portion 32 are arranged in parallel with each other. Further, in the circuit body 30, the second substrate portion 32 is formed longer than the first substrate portion 31.

In the circuit body 30, the end portions of the conductors 36 of the first substrate portion 31 and the second substrate portion 32 are drawn from opposite sides in the connector mounting portion 45 and arranged. The conductors 36 in the connector mounting portion 45 of the circuit body 30 are arranged in the voltage order, that is, the voltage detection lines L1 to L7 in order of the battery cells.

As illustrated in FIG. 6B, the connector connecting portion 32c of the second substrate portion 32 is folded and bent in a perpendicular direction and inverted. Further, as illustrated in FIG. 6C, the connector connecting portion 32c of the second substrate portion 32 is folded and bent in a perpendicular direction and inverted. In this way, the length of the second substrate portion 32 is made substantially identical to the first substrate portion 31 and the first substrate portion 31 and the second substrate portion 32 are separated from each other.

Then, the bus bars 20A and 20B are joined to the connection port portion 41 of the first substrate portion 31 and the second substrate portion 32 of the circuit body 30, and the connector 40 is attached to the connector mounting portion 45.

In the battery module 10 manufactured in this manner, the bus bars 20A and 20B are fastened and fixed to the electrodes 3 of the respective battery cells 2 of the battery assembly 1 by nuts and the connector 40 is joined to the ECU 5. Thereby, the ECU 5 detects the voltage of the battery cell 2 of the battery assembly 1 and monitors the voltage of each battery cell 2 to adjust the charge amount and the like.

As described above, according to the battery module 10 of the embodiment, the battery wiring portions 31a and 32a of the circuit body 30 are wired along the respective rows of the electrodes 3 of the battery cells 2 and the conductors 36 are connected to the bus bars 20A and 20B fixed to the electrodes 3. Further, in the connector 40 mounted on the connector mounting portion 45 of the circuit body 30, the odd-numbered terminals T1, T3, T5, and T7 from one end side are connected to the conductors 36 of one battery wiring portion 31a and the even-numbered terminals T2, T4, and T6 from one end side are connected to the conductors 36 of the other battery wiring portion 32a. Therefore, the conductors 36 can be connected to the terminals T1 to T7 of the connector 40 attached to the connector mounting portion 45 so as to be in the order of voltage of the battery assembly 1. Therefore, when connecting the connectors 40 to the ECU 5 which monitors the voltage of the battery cell 2 and adjusts the charge amount and the like, it is not necessary to provide a circuit or the like for rearranging the voltage detection lines L1 to L7 in the order of voltage on the ECU 5, and thus the circuit can be simplified.

Specifically, since the circuit body 30 is formed of one substrate including the first substrate portion 31 and the second substrate portion 32 having the battery wiring portions 31a and 32a routed along respective rows of the electrodes 3 of the battery cells 2, the connector connecting portions 31c and 32c with the connector mounting portion 45 to which the connector 40 is attached, and the connecting portions 31b and 32b, it is possible to improve the assembling efficiency to the battery assembly 1.

The invention is not limited to the embodiment described above and appropriate modifications, improvements, and the likes are possible. In addition, the material, shape, size, number, arrangement location, and the like of each component in the embodiment described above are arbitrary and not limited as long as the invention can be achieved.

For example, although a case where the circuit body 30 is formed of a single substrate made of a flexible circuit board is exemplified in the embodiment described above, the circuit body 30 may be formed of a plurality of substrates. Here, a battery module according to a modification example in which the circuit body 30 is constituted of two substrates will be described.

Figure 7:
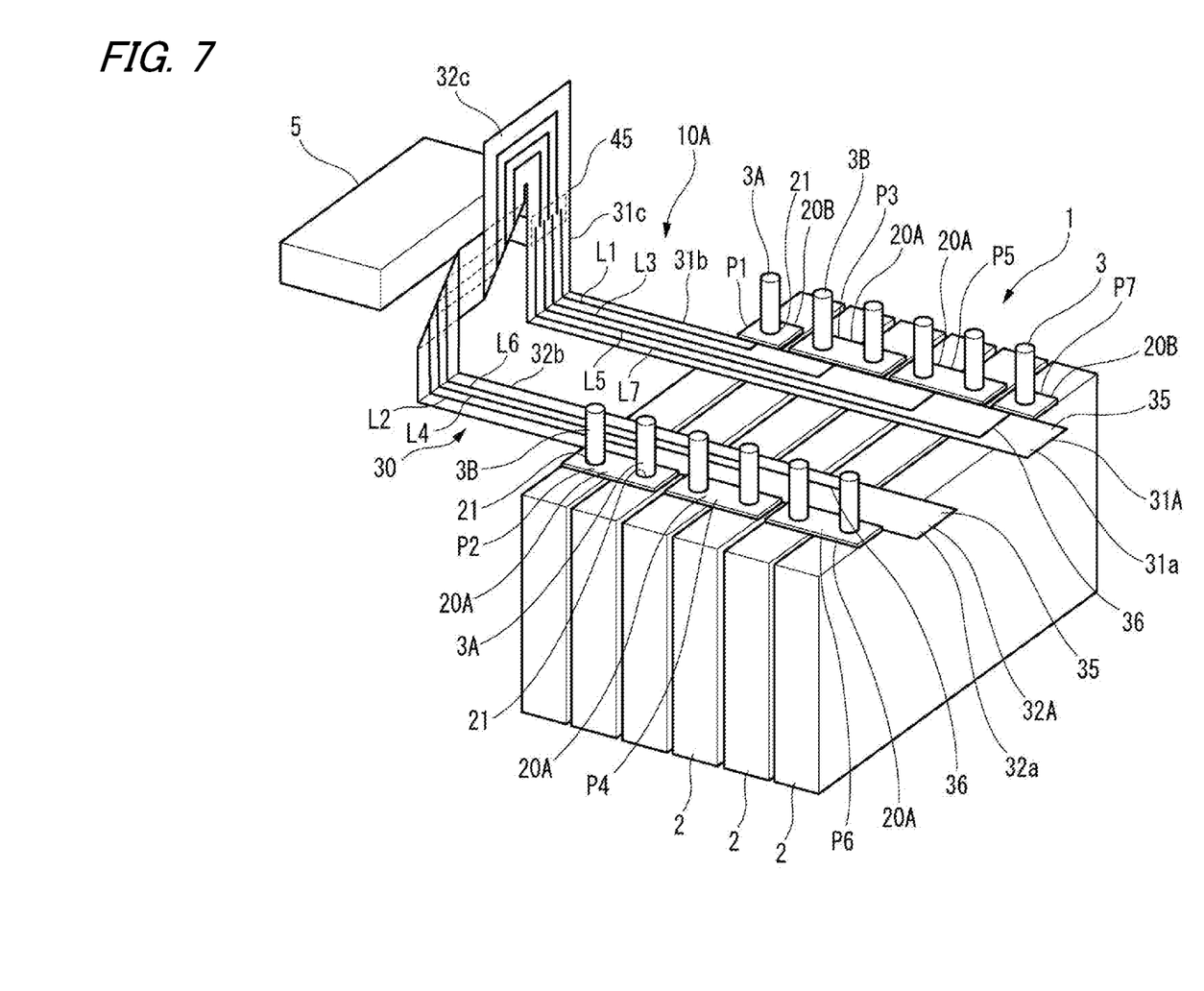
FIG. 7 is a perspective view from a rear of a battery assembly in which a battery module according to a modification example is assembled.
Figure 8:
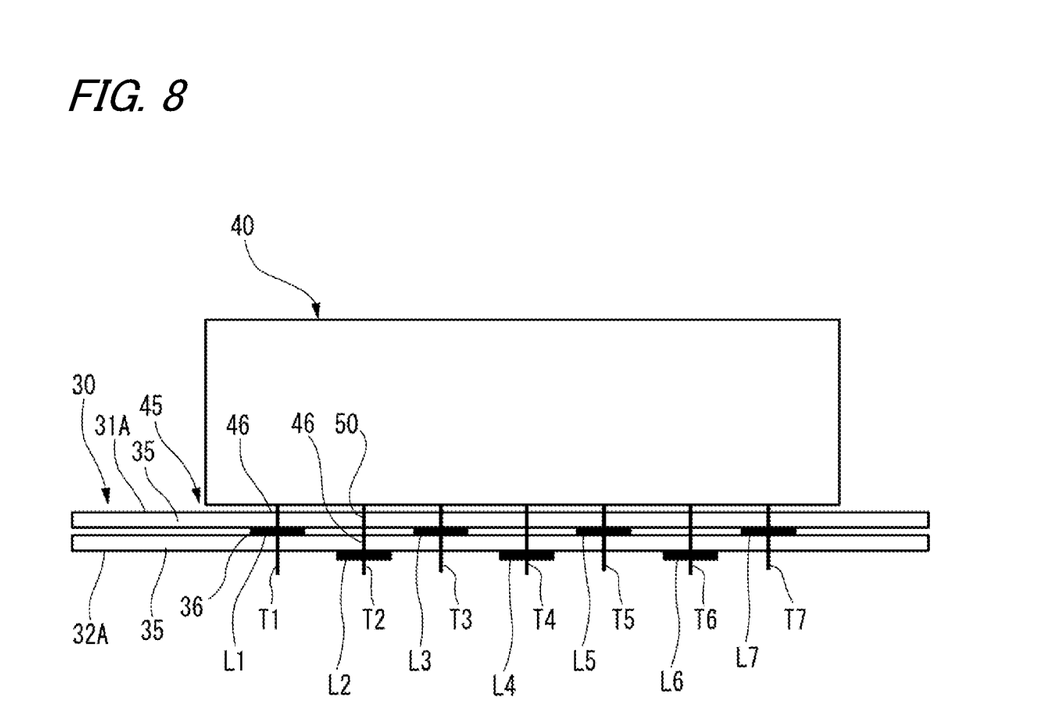
FIG. 8 is a schematic cross-sectional view of a connector mounting portion of the circuit body.

FIG. 7 is a perspective view from a rear of a battery assembly in which a battery module according to a modification example is assembled. FIG. 8 is a schematic cross-sectional view of the connector mounting portion of the circuit body.

As illustrated in FIG. 7, in a battery module 10A, the circuit body 30 is constituted of a first substrate 31A having the battery wiring portion 31a, the connecting portion 31b, and the connector connecting portion 31c and a second substrate 32A having the battery wiring portion 32a, the connecting portion 32b, and the connector connecting portion 32c. In those first substrate 31A and second substrate 32A, the connectors connecting portions 31c and 32c are connected in the opposite direction to each other and this connecting point becomes the connector mounting portion 45. In the connector mounting portion 45, the connector connecting portions 31c and 32c are overlapped on each other. The connector 40 is attached to the connector mounting portion 45 from the first substrate 31A.

As illustrated in FIG. 8, in the connector connecting portion 31c of the first substrate 31A, the through holes 50 are formed between the conductors 36. In the connector 40 mounted on the connector mounting portion 45, the odd-numbered terminals T1, T3, T5, and T7 are connected to the conductors 36 of the voltage detection line L1, L3, L5, and L7 of the first substrate 31A on the near side with respect to the connector 40. In the connector 40, the even-numbered terminals T2, T4, and T6 pass through the through holes 50 of the first substrate 31A on the near side with respect to the connector 40 and are connected to the conductors 36 of the voltage detection lines L2, L4, and L6 of the second substrate 32A on the far side with respect to the connector 40.

As described above, according to the battery module 10A including the circuit body 30 constituted of the first substrate 31A and the second substrate 32A, the battery wiring portions 31a and 32a of two sheets of the first substrate 31A and the second substrate 32A can be separately arranged and mounted with respect to the rows of the electrodes 3 of the battery assembly 1. Thereby, two sheets of the first substrate 31A and the second substrate 32A can be easily attached to the battery assembly 1 without being affected by the width of the row of electrodes 3 and the like. Further, the circuit body 30 can be manufactured with high yield as compared with a case where the circuit body 30 is formed by one substrate.

Further, the odd-numbered terminals T1, T3, T5, and T7 from one end side of the connector 40 are connected to the conductors 36 of the first substrate 31A on the near side with respect to the connector 40 and the even-numbered terminals T2, T4, and T6 from one end side pass through the through holes 50 formed on the first substrate 31A on the near side with respect to the connector 40 and are connected to the conductors 36 of the second substrate 32A on the far side with respect to the connector 40. Therefore, in the connector mounting portion 45 where the connector connecting portions 31c and 32c of the two sheets of the first substrate 31A and the second substrate 32A are overlapped, the terminals T1 to T7 of the connector 40 can be reliably connected to the conductors 36 of the first substrate 31A on the near side with respect to the connector 40 and the second substrate 32A on the far side.

In the embodiment described above, the battery wiring portions 31a and 32a are routed inside the respective rows of the electrodes 3 of the battery cells 2. However, the battery wiring portions 31a and 32a may be routed outside the respective rows of the electrodes 3 of the battery cells 2.

A flexible circuit board used as a board constituting the circuit body 30 may have a structure where the conductors 36 are provided in at least one of the front and rear surfaces of the base 35 made of a film having flexibility and it is coated with insulating resin material.

In the embodiment described above, each battery cell 2 constituting the battery module 10 is not limited to a rectangular shape as illustrated in FIG. 1 and the like and may be a cylindrical shape. In this case, since the positive electrode and the negative electrode are arranged at both end portions in a cylinder axial direction of each battery cell 2, for example, the first substrate 31 and the second substrate 32 are routed along respective end portions.

In the embodiment described above, a case where the positive electrode 3A and the negative electrode 3B of the battery cell 2 are alternately arranged to be adjacent to each other in the battery module 10 is described as an example, but the invention is not limited thereto. The battery module 10 may be configured such that the positive electrodes 3A and the negative electrodes 3B of several adjacent battery cells 2 of a plurality of battery cells 2 are adjacent to each other, that is, several battery cells 2 are connected in parallel.

Here, the features of the circuit body and the battery module according to the embodiments of the invention described above will be briefly summarized and listed in the following [1] to [5].

[1] A circuit body (30) which is attached to a battery assembly (1) in which electrodes (3) of a plurality of battery cells (2) are arranged in two rows and two or more electrodes adjacent to each other in each row are connected by a conductive member (a plurality of bus bars 20A, 20B), including:

a plurality of conductors (36) and a substrate (first substrate portion 31, second substrate portion 32, first substrate 31A, second substrate 32A) having flexibility and provided with the plurality of conductors, in which the substrate (first substrate portion 31, second substrate portion 32, first substrate 31A, second substrate 32A) includes a battery wiring portion (31a, 32a) which is routed along each row of the electrodes (3) and where one ends of the plurality of conductors (36) are respectively connected to the conductive members (a plurality of bus bars 20A, 20B), and a pair of connector connecting portions (31c, 32c) in which the other ends of the conductors (36) provided in respective battery wiring portions (31a, 32a) are respectively located, the pair of connector connecting portions (31c, 32c) include a connector mounting portion (45) which is a position where the connector connecting portions are guided from opposite directions and connected and where the connector (40) is mounted, and in the connector mounting portion (45), the other ends of the conductors (36) of the pair of the connector connecting portions (31c, 32c) are alternately arranged and an arrangement order corresponds to the potential order of the conductive members (a plurality of bus bars 20A, 20B) connected to the conductors (36).

[2] The circuit body according to [1], in which
the substrate (first substrate portion 31, second substrate portion 32) is formed of one sheet and includes a plurality of substrate portions having the battery wiring portions (31a, 32a) and the connector connecting portions (31c, 32c).

[3] The circuit body according to [1], in which
the substrate (first substrate 31A, second substrate 32A) is formed of two sheets, and
the connector mounting portion (45) is located at a position where the connector connecting portions (31c, 32c) of the two substrates (substrate 31A, second substrate 32A) are connected in an opposite direction to each other.

[4] The circuit body according to [3], in which
the connector connecting portions (31c, 32c) of the two substrates (first substrate 31A, second substrate 32A) are overlapped in the connector mounting portion (45), and
a through hole (50) for connecting the conductor (36) of the substrate (second substrate 32A) on a far side with respect to the connector (40) and a terminal of the connector (40) is formed in the substrate (first substrate 31A) on a near side with respect to the connector (40).

[5] A battery module (10, 10A), including:
the circuit body (30) according to [1],
a conductive member (a plurality of bus bars 20A, 20B) connected to one end of a conductor (36) constituting the circuit body (30), and
a connector (40) connected to the other end of the conductor.

What is claimed is:

1. A circuit body which is attached to a battery assembly in which electrodes of a plurality of battery cells are arranged in two rows and two or more electrodes adjacent to each other in each row are connected by a conductive member, comprising:

a plurality of conductors and a substrate having flexibility and provided with the plurality of conductors, wherein the substrate includes a battery wiring portion which is routed along each row of the electrodes and where one ends of the plurality of conductors are respectively connected to the conductive members, and a pair of connector connecting portions in which the other ends of the conductors provided in respective battery wiring portions are respectively located, the pair of connector connecting portions include a connector mounting portion which is a position where the connector connecting portions are guided from opposite directions and connected and where the connector is mounted, and in the connector mounting portion, the other ends of the conductors of the pair of the connector connecting portions are alternately arranged and an arrangement order corresponds to the voltage order of the conductive members connected to the conductors.

2. The circuit body according to claim 1, wherein
the substrate is formed of one sheet and includes a plurality of substrate portions having the battery wiring portions and the connector connecting portions.

3. The circuit body according to claim 1, wherein
the substrate is formed of two sheets, and
the connector mounting portion is located at a position where the connector connecting portions of the two substrates are connected in an opposite direction to each other.

4. The circuit body according to claim 3, wherein
the connector connecting portions of the two substrates are overlapped in the connector mounting portion, and
a through hole for connecting the conductor of the substrate on a far side with respect to the connector and a terminal of the connector is formed in the substrate on a near side with respect to the connector.

5. A battery module, comprising:
the circuit body according to claim 1,
a conductive member connected to one end of a conductor constituting the circuit body, and
a connector connected to the other end of the conductor.

6. The circuit body according to claim 1, wherein
the substrate is formed of a first substrate portion and a second substrate portion each having the battery wiring portions and the connector connecting portions, and
in the connector mounting portion, the other ends of the conductors of the connector connecting portions of the second substrate are arranged between the other ends of the conductors of the connector connecting portions of the first substrate portion.

7. The circuit body according to claim 6, wherein
the connector connecting portion of the first substrate is connected to the connector connecting portion of the second substrate from an opposite side.

8. The circuit body according to claim 6, wherein
the connector connecting portion of the first substrate and the connector connecting portion of the second substrate are connected in the opposite direction to each other and overlap each other.

9. The circuit body according to claim 1, wherein
in the connector mounting portion, the other ends of the conductors of the pair of the connector connecting portions are alternately arranged such that one of the pair of connector connecting portions is arranged between the other of the pair of connector connecting portions and an arrangement order corresponds to the voltage order of the conductive members connected to the conductors.

\* \* \* \* \*